United States Patent [19]
Shiga et al.

[11] Patent Number: 5,346,883
[45] Date of Patent: Sep. 13, 1994

[54] METHOD OF MANUFACTURING SUPERCONDUCTIVE PRODUCTS

[75] Inventors: Shoji Shiga, Utsunomiya; Naoki Uno; Yasuzo Tanaka, both of Yokohama, all of Japan

[73] Assignee: The Furukawa Electric Co., Ltd., Tokyo, Japan

[21] Appl. No.: 9,383

[22] Filed: Jan. 27, 1993

Related U.S. Application Data

[63] Continuation of Ser. No. 754,247, Aug. 26, 1991, abandoned, which is a continuation of Ser. No. 528,901, May 24, 1990, abandoned, which is a continuation of Ser. No. 233,270, Aug. 17, 1988, abandoned.

[30] Foreign Application Priority Data

Aug. 21, 1987 [JP] Japan ................. 62-207829
Aug. 21, 1987 [JP] Japan ................. 62-207955
Aug. 25, 1987 [JP] Japan ................. 62-210423
Sep. 4, 1987 [JP] Japan ................. 62-221305

[51] Int. Cl.$^5$ ........................................... H01L 39/24
[52] U.S. Cl. ........................... 505/100; 29/599; 264/57; 505/704; 505/740
[58] Field of Search ............... 29/599; 505/1, 705, 505/704, 725, 736, 740, 742; 264/57, 165, 166

[56] References Cited

U.S. PATENT DOCUMENTS

| | | | |
|---|---|---|---|
| 2,968,551 | 1/1961 | North et al. ................ | 264/57 X |
| 3,846,082 | 11/1974 | Labelle, Jr. et al. ........ | 264/165 X |
| 3,861,450 | 1/1975 | Mobley et al. .............. | 264/165 X |
| 4,358,416 | 11/1982 | Yarwood et al. ............ | 264/165 X |
| 5,011,823 | 4/1991 | Jin et al. ..................... | 505/1 |

FOREIGN PATENT DOCUMENTS

0295023 6/1988 European Pat. Off. .

OTHER PUBLICATIONS

"Fabrication of Dense $Ba_2YCu_3O_{7-\delta}$ Superconductor Wire by Molten Oxide Processing", Jin et al. Applied Physics Letter 51(12), Sep. 21, 1987.

M. Okada et al., "Fabrication of Ag-sheathed Ba-Y-Cu oxide superconductor tape", Japanese Journal of Applied Physics, vol. 27, No. 2, Part 2, Feb. 1988, pp. L185-L187.

K. Matsuzaki et al., "Critical current density and electrical resistivity of high Tc superconductors in the La-Sr-Cu-O system prepared by the solidification method", Journal of Materials Science Letters, vol. 6, 1987, pp. 990-992.

C. A. Costa et al., "Synthesis of $YBa_2Cu_3O_{7-x}$ polycrystalline superconductors from Ba peroxide: First physico-chemical characterization", Journal of Crystal Growth, vol. 85, 1987, pp. 623-627.

P. J. McGinn et al., "Texture processing of $YBa_2Cu_3O_{7-x}$ by joule heat zone melting", Physica C, vol. 156, No. 1, Aug. 1, 1988, pp. 57-61.

*Primary Examiner*—Joseph M. Gorski
*Attorney, Agent, or Firm*—Frishauf, Holtz, Goodman & Woodward

[57] ABSTRACT

The present invention provides a method of manufacturing superconductive products comprising heating a superconductive matter or incorporation including its precursor to a temperature higher than its or its precursor's melting point to melt it or its precursor, and then solidifying and cooling it in a direction in such a way that it is re-crystalized to have an orientation in the longitudinal direction of its incorporation.

20 Claims, 1 Drawing Sheet

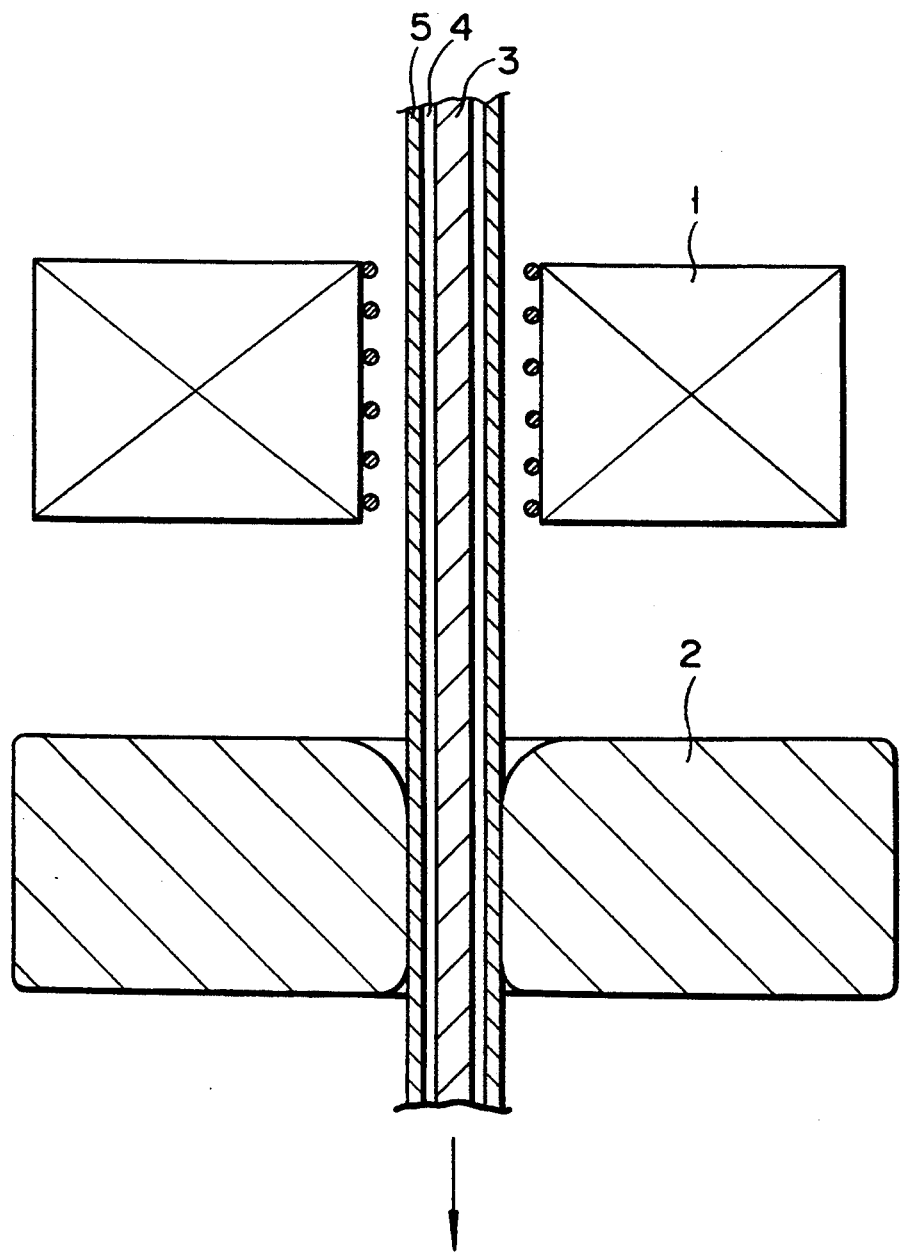
F I G. 1

METHOD OF MANUFACTURING SUPERCONDUCTIVE PRODUCTS

This application is a continuation of application Ser. No. 07/754,247 filed Aug. 26, 1991 (abandoned), which is a continuation of application Ser. No. 07/528,901 filed May 24, 1990 (abandoned); which is a continuation of application Ser. No. 07/233,270 filed Aug. 17, 1988 (abandoned).

BACKGROUND OF THE INVENTION

1. Field of the Invention

The present invention relates to a method of manufacturing superconductive products, particularly those of high critical temperatures (Tc) and improved critical current densities (Jc).

2. Description of the Related Art

Nb-Ti, Nb-Zr, Nb-Ti-Zr, $Nb_3Sn$, $V_3Ga$ and the like have been practically used as superconductive matters. These matters can be easily prepared by plastic processing raw materials which have been compounded with a stabilizing metal such as Cu and Al. It has been well known that compounds such as $Nb_3Sn$ are diffused at the final process according to the bronze method.

However, these matters have critical temperatures (Tc) lower than about 20° K. and need liquid helium, which is expensive and extremely low in temperature, as their cooling medium.

Superconductive matters of the ceramic or nonmetal type such as oxides having critical temperatures higher than the boiling point of cheap liquid hydrogen or nitrogen have been recently provided. These are stratified compounds of the $K_2NiF_4$ or three-layer perovskite type in the group of Ln—A—Cu—O wherein Ln represents Y, Sc or other rare earth elements and A denotes alkaline earth elements such as Ba and Sr. They are, for example, $YBa_2Cu_3O_7-\delta$ $ErBa_2Cu_3O_7-\delta$ $YBaSrCu_3O_7-\delta$ $(La_{1-x}Sr_x)_2CuO_4$ and the like and include even those where oxgen is replaced by fluorine, sulfur or the like.

The superconductive matters of the ceramic type can become superconductive at high temperature (Tc) and are expected to be used for power transmission lines of large capacity, magnets of high magnetic field and so on. However, it is extremely difficult to process the ceramic superconductive matters, as compared with those of the metal type such as Nb, and it has been therefore proposed that powder of the ceramic superconductive matters which has been previously subjected to the burning treatment or which is not burned yet is used as raw material, and that this raw material powder is deposited on a base of desired form or molded, metal covered and elongated to a line product. These line products are further processed to a twisted line or coil, if necessary.

In the case of the superconductive matters of the oxide type such as $YBa_2Cu_3O_7-\delta$, therefore, raw material powder of oxide and carbonate, for example, is preburned to provide a compounded oxide, which is powdered, then made to fill a metal sheath, compressed by the rubber press to raise its density, and then processed to a line product of desired diameter. These line products are twisted together to a twisted line or processed to a coil, if necessary, which is further sintered in an air or oxygen atmosphere.

Even if the powder of the superconductive matters is made to fill the metal sheath and processed to the line product according to the conventional method of manufacturing the ceramic superconductive products, the density of the powder filling the metal sheath is low, ranging about 70%, and when this powder made to fill the metal sheath like this is processed to a twisted line or cable and then sintered, its volume is contracted more than 20%. Clearance is thus formed between the powder and the metal sheath and this causes the thus-made products to be inferior in their superconductivity.

Even when the superconductive matter is elongated to a line product, it is difficult to arrange its crystals in a direction because it is powder made to fill the metal sheath. This also make it impossible to provide superconductive products having excellent superconductivity.

SUMMARY OF THE INVENTION

The object of the present invention is to provide a method of manufacturing ceramic superconductive products high in density and excellent in superconductivity.

According to the present invention, there can be provided a method of manufacturing superconductive products comprising heating a superconductive matter or its precursor or a body containing said superconductive matter (i.e., material) or precursor to a temperature higher than its or its precursor's melting point to melt it or its precursor, and then solidifying and cooling it in a direction in such a way that it is re-crystalized to have an orientation in the longitudinal direction of the body in which it is incorporated.

1) Superconductive matters or their precursors deposited on a heat-resisting base, 2) line-like products made by filling the superconductive matter or its precursor in a metal sheath, and 3) those formed to various desired shapes by bending a plurality of the line-like products, for example, can be cited as the superconductive matters or bodies including their precursors in the present invention.

Products having excellent superconductivity can be prepared by the present invention when superconductive matters or their precursors of the oxide type in the groups of Re—Ba—Cu—O (Re: rare earth element), Bi—Sr—Ca—Cu—O and Tl—Ba—Ca—Cu—O.

When matters having this stratified perovskite structure are used, the amount of oxygen entering into and coming out of the system must be controlled because phase transition occurs, keeping oxygen in and out, in the process of cooling the matters after they are solidified. It is therefore desirable that heating and cooling of the superconductive matters or their precursors are carried out in oxygen abundant atmosphere, particularly in an atmosphere in which oxygen partial pressure is 0.2–50 atm.

Particularly when the superconductive matter or its precursor made to fill the metal sheath is heated and cooled, the supply of oxygen to the matter or its precursor through the metal sheath is not sufficient. It is therefore preferable that the matter or its precursor is heated in oxygen abundant atmosphere or that a small amount of metal peroxide such as mercury peroxide and copper oxide is previously mixed, as oxidizing agent, with the superconductive matter or its precursor which is to be made to fill the metal sheath.

The material by which the metal sheath is made preferably has a melting point higher than that of the superconductive matter or its precursor filled. It is also preferable that the metal sheath material is more difficultly oxidized. Stainless steel, silver, platinum and the like can be used as the metal sheath material. It is needed that the temperature at which the superconductive matter or its precursor made to fill the metal sheath is heated and melted is lower than the melting point of the metal sheath because the melted superconductive matter must be held by the metal sheath. When this temperature becomes 200° C. or more higher than the melting point of the superconductive matter, the vapor pressure of the melt becomes high and reaction thereof with the metal sheath becomes severe. It is therefore preferable that the temperature for heating and melting the superconductive matter or its precursor is kept in a range of just a little higher than the melting point of the superconductive matter to 200° C. higher.

Various embodiments of the present invention will be described in more detail.

An embodiment of the present invention comprises a first process of fixing a superconductive matter or its precursor of the ceramic type onto a heat-resisting continuous base, and a second process of continuously heating the fixed matter or precursor from one end thereof to the other to a temperature higher than the melting point of the superconductive matter, melting at least a part of it and then successively cooling and re-crystalizing it.

The first process is carried out by coating the superconductive matter or its precursor on the heat-resisting continuous base according to the vapor-depositing or spattering method. When a relatively thick coating of the matter is needed in this case, it may be arranged that fine powder of the superconductive matter or its precursor is mixed with a binder and fixed to the base or molded or pressed onto the base and then sintered. It may also be arranged that the fine powder is uniformly fixed and sintered onto the base according to the flame spraying method.

According to the second process, the base on which the superconductive matter or its precursor of the ceramic type has been coated is continuously heated from one end thereof to the other to melt the matter or its precursor and the thus melted matter or precursor is then cooled and re-crystalized.

When the superconductive matters are of the oxide type, the first and second processes are carried out in an atmosphere of $O_2$. Electric furnace, beam, flame, plasma or the like can be used as the heating source. Cooling is carried out at any optional speed and temperature in such a way that the matter covered base or precursor covered base is continuously moved from a hot melting section to a low temperature section.

The first and second processes may be combined as a continuous process or used as a process independent of the other.

Lines, filaments, tapes, stripes and the like made by inorganic matter such as Pt, Ag, Cu, Fe, stainless steel, Ni, Co, W, Mo or their alloys, carbon, SiC, $Al_2O_3$ or $SiO_2$ can be used as the heat-resisting continuous base.

The superconductive matter which has been thinly fixed and covered on the heat-resisting continuous base is heated and melted at a temperature of about 1000°–1600° C. Excessive melting of the matter is not preferable because the matter is decomposed and evaporated to change its composition. In order to prevent the part of oxygen from being reduced, it is needed that the superconductive matter is processed in $O_2$ or pressurized $O_2$ atmosphere. It is preferable that $O_2$ partial pressure is usually in a range of 0.2–50 atm.

In the case where the superconductive matter or its precursor fixed on the base is too thick, it loses its flexibility and becomes fragile when used as a continuous stripe product or the like. It is therefore preferable to keep the superconductive matter thin on the base. Particularly, the melted superconductive matter must be held on the base, keeping its surface tension and viscosity balanced with gravity and other external mechanical force. When the melted superconductive matter is thin on the base, it can be easily controlled and uniformly cooled. In addition, it is advantageous in its being re-crystalized in one direction. It is preferably in range of 0.1–50 $\mu$m. When it is too thin, it cannot serve as a conductor because it has no sufficient current-carrying capacity.

The continuous heat-resisting base must have heat resistance durable against any treatment employed by the present invention. In addition, it must have, as a conductor, mechanical strength, plasticity, heat conductivity and the like. In order to economically increase the current-carrying capacity essential to the practical superconductive products, it is preferable that the diameter of the line-like base or thickness of the tape-like base is made small. Needless to say, too large bases reduce the effective sectional area of the conductor. It is therefore preferable to keep the diameter or thickness of the line- or tape-like base in a range of 0.1–500 $\mu$m.

This embodiment of the present invention comprises the above-mentioned two processes, but other processes may be added to these two processes, if necessary. The crystal structure and composition of the superconductive products may be adjusted by heat or $O_2$ plasma treatment after the re-crystalizing process. Further, the superconductive products may be covered by metal such as Ag, Cu, Al and Sn to keep them protected from air outside and increase their heat conductivity to stabilize them. They may be covered by ceramics or organic matters.

Another embodiment of the present invention will be described.

This second embodiment comprises filling either of ceramic superconductive matter powder or its precursor powder which has been previously burned into a metal sheath and a) heating the powder in the metal sheath to a predetermined temperature higher than the melting point of the powder but lower than the melting point of the metal sheath to melt it and process it together with the metal sheath to a line, or b) processing the powder in the metal sheath to a line having a predetermined diameter, then continuously and locally heating this line to a temperature higher than the melting point of the superconductive matter or its precursor to melt the powder in the metal sheath, and continuously cooling and solidifying it in a direction.

The process a) of melting the powder filled in the metal sheath and elongating it together with the metal sheath to a line will be described.

The elongating step of the process a) is carried out at high temperature. Therefore, the elongating step using no die but tension is more advantageous than the one using dies. It is preferable at this elongating step using no die that one passage reduction is made small from the viewpoint of controlling the diameter of the line and that the heating, melting and elongating steps are repeated many times.

The powder reacts with itself or with a metal peroxide in the course of the heating, melting and elongating steps to thereby adjust its crystal structure and the amount of oxygen, so that a complete ceramic superconductive product can be provided. And when it is quickly cooled after the elongating step, its crystals are made fine to further enhance its property.

In the case of those superconductive matters whose phase transition occurs at the quick cooling step after the elongating one, their phase transition must be caused without failure by quickly cooling them at a temperature higher than their phase transition temperature and then gradually cooling them at a temperature lower than it, or by quickly cooling them to a temperature lower than their phase transition temperature, heating them again to a temperature higher than it and then gradually cooling them.

The ceramic superconductive products thus provided are extremely high in their filled density and their superconductive property can be made extremely excellent when their crystals are made fine by the quick cooling step.

The process b) of area-reducing the metal sheath in which the powder has been filled to a line having a predetermined diameter and heat-treating this line will be described.

According to the so-called zone melting manner, the line in which the powder of the superconductive matter has been filled is continuously heated and then cooled and the powder is thus melted and solidified in a direction. As the result, the superconductive products thus made can have a higher filled density and an orientation of their crystals to enhance their superconductivity.

Since the powder of the superconductive matter which is to be melted has conductivity, it is preferable that the zone melting manner comprises heating and melting the line through a small size high frequency coil and cooling and solidifying it by moving it in its longitudinal direction at a low speed. Its diameter is preferably in a range of about 0.5–1 mm$\phi$ from the viewpoint of its flexibility after solidification and its being easy to undergo the zone melting method.

A further embodiment of the present invention will be described.

This third embodiment comprises filling the powder of a ceramic superconductive matter into a metal pipe, area reducing the metal pipe to a line having a predetermined diameter, bending this line or a plurality of the lines to a desired form, locally and continuously heating the thus-formed body to a temperature higher than the melting point of the superconductive matter to melt the powder in the pipe and then continuously cooling the melt to solidify it in a direction.

According to the third embodiment using the so called zone melting method, the line in which the superconductive matter powder has been filled is processed to a desired form and the body thus made is continuously heated and then cooled to melt the powder in the line and solidify it in a direction, so that the superconductive product thus obtained can have a higher filled density and orient its crystals to enhance its superconductivity.

It is preferable that the zone melting manner is intended to use a small sized high frequency coil to heat and melt the powder in the formed line and cool and solidify it, keeping it moved in its longitudinal direction at a low speed, because the superconductive matter powder which is to be melted has conductivity. The outer diameter of each of the lines is preferably in a range of about 0.5–1 mm$\phi$, considering their flexibility and their easiness to accept the zone melting method.

When they are twisted to form a twisted line, however, no particular limitation is applied to the outer diameter of the twisted line. When they are used as coils, no limitation is also applied to their outer diameters, however they may be used in the form of a single line or twisted lines. The zone melting method may be carried out in such a way that one end of the super-conductive coil in the metal sheath is passed through a loop of the high frequency heating coil and that the superconductive coil is moved in its longitudinal direction while being rotated.

According to the method of the present invention, the body incorporating a superconductive matter or its precursor is heated to a temperature higher than the melting point of the superconductive matter or its precursor and it is thus melted and then cooled and re-crystalized. Therefore, the superconductive products thus obtained can have a higher density and a structure in which their crystals can be oriented in one direction, thereby enhancing their superconductivity.

More concretely, the superconductive matter fixed and coated on the continuous base is melted from one end thereof to the other and then cooled successively according to the first embodiment of the present invention. When the cooling speed and the like are controlled, therefore, the crystals of the matter can be easily oriented. As the result, the superconductive product thus obtained can have uniform and dense crystals which are oriented. Particularly in the case of the superconductive matters of the oxide type, it is important to orient their crystals because they have anisotropy and exhibit more excellent superconductivity in the directions of axes a and b, as compared with that in the direction of axis c.

According to the second embodiment of the present invention, the superconductive matter powder is filled in the metal sheath and a) heated to enable the melted powder to be elongated or b) area-reduced to form a line having a predetermined diameter, and this line is then cooled continuously to solidify the melted powder in a direction. Therefore, superconductive products thus obtained can have dense and uniform crystals which are oriented, thereby enhancing their superconductivity.

According to the third embodiment of the present invention, the ceramic superconductive matter powder is filled in the metal sheath and area reduced to form a line having a predetermined diameter. This or these lines are then bent into a predetermined form, and this body is continuously and locally heated to a temperature higher than the melting point of the superconductive matter to melt the ceramic superconductive matter powder in the body. The melted powder is then continuously cooled and solidified to orient its crystals in a direction. Therefore, the superconductive products thus obtained can have a higher density and a structure in which their crystals are oriented in one direction, thereby enhancing their superconductivity.

BRIEF DESCRIPTION OF THE DRAWINGS

FIG. 1 shows an example of the heating and cooling apparatus of the vertical type through which superconductive lines made according to the present invention are heated and cooled.

DETAILED DESCRIPTION OF THE PREFERRED EMBODIMENTS

The present invention will be described in more detail, referring to some embodiments thereof.

An embodiment of the present invention will be described citing examples 1–7 and comparison examples 1–2.

EXAMPLE 1

A line of Mo which was 100 $\mu m\phi$ was coated with MgO of 1.0 $\mu m$ thickness according to the spattering method. The line thus obtained was painted with a paste, which had the following composition, according to the die method.

$YBa_2Cu_3O_{7-\delta}$: 1.5 $\mu m\phi$ (average particle size) 75 wt %
ethyl cellulose: 10 wt %
butyl carbinol: remaining weight percentage The painted line was processed for a minute at 600° C. and then for 25 minutes at 950° C. in an air furnace. A line material having a coating of 17 $\mu m$ thereon was thus obtained. The line material was continuously passed through a high frequency heating furnace in a 15 atm atmosphere of $O_2$. This furnace included a portion of about 30 mm which was heated to 1300° C., and the temperature at the outlet of the furnace was 500° C.

The interval between the high frequency heating section in the furnace and the outlet of the furnace was 750 mm, and the speed of the line material moving in the furnace was 100 mm/min. The thickness of the superconductive layer on the finished line product was 15 $\mu m$.

EXAMPLE 2

The thickness of the paste painted on the base material according to the die manner in Example 1 was adjusted to be about 1.3 $\mu m$ and the base material thus obtained was processed in same fashion as in Example 1. The thickness of the superconductive layer on the finished line product thus obtained was 0.9 $\mu m$.

EXAMPLE 3

MgO line of 300$\mu m\phi$ was used instead of Mo line of 100 $\mu m\phi$ and $Y_{0.7}Er_{0.3}Ba_{1.5}Sr_{0.5}Cu_3O_{7-\delta}$ was used instead of $YBa_2Cu_3O_{7-\delta}$. The thickness of the paste painted was 8 $\mu m$, the melting temperature in the furnace was 1270° C., and the outlet temperature of the furnace was 500° C. The speed of the line material in the furnace was 500 mm/min. The thickness of the superconductive layer on the finished line product thus obtained was 7.3 $\mu m$.

EXAMPLE 4

The thickness of the paste painted in Example 3 was changed to about 40 $\mu m$ and the line material thus obtained was processed in same manner as in Example 3. A line product with a 3.7 $\mu m$ thick superconductive layer was thus obtained.

EXAMPLE 5

The line material in Example 1 was further processed for 3 hours in $O_2$ atmosphere of 700° C.

EXAMPLE 6

The line material in Example 2 was further processed for 15 minutes in a low temperature $O_2$ plasma (about 200° C.).

COMPARISON EXAMPLE 1

The re-crystalizing process in Example 1 was carried out in 1 arm atmosphere of $N_2$.

COMPARISON EXAMPLE 2

The thickness of the paste painted in Example 3 was changed to about 75 $\mu m$ and the painted line was processed in same manner as in Example 3.

Critical current density (Jc) was measured in $N_2$ liquid (77° K.) about each of the line products thus obtained. External magnetic field (H) was set at 0 Tesla and 0.5 Tesla. Results thus obtained were shown in Table 1. Critical current density (Jc) was also measured under same condition about Examples 1–6 which were not re-crystalized yet, and results thus obtained are also shown in Table 1.

TABLE 1

| Line material | No. | Jc(A/cm$^2$) H = 0 Tesla | H = 0.5 Tesla |
|---|---|---|---|
| Example 1 | 1 | 407 × 10$^3$ | 85 × 10$^3$ |
| Example 2 | 2 | 680 | 390 |
| Example 3 | 3 | 930 | 660 |
| Example 4 | 4 | 550 | 290 |
| Example 5 | 5 | 630 | 300 |
| Example 6 | 6 | 710 | 420 |
| Comparison Example 1 | 7 | 0 | 0 |
| Comparison Example 2 | 8 | 58 | 9 |
| Example 1 prior to recrystalizing process | 9 | 0.5 | 0 |
| Example 2 prior to recrystalizing process | 10 | 0.7 | 0 |
| Example 3 prior to recrystalizing process | 11 | 0.8 | 0 |
| Example 4 prior to recrystalizing process | 12 | 0.5 | 0 |
| Example 5 prior to recrystalizing process | 13 | 0.5 | 0 |
| Example 6 prior to recrystalizing process | 14 | 0.7 | 0 |

As apparent from the results shown in Table 1, it has been found that superconductive line products whose permissible superconductive current is increased to a great extent can be obtained according to the present invention. As the paste pained becomes thicker, current density seems to become lower. The comparison examples having particularly thick coating show much better results than those of the examples prior to the re-crystalizing process but worse results than those of the examples having thin coating. Comparison example 1 was processed in an atmosphere in which no $O_2$ was included, and it was not finished as a superconductive product accordingly.

EXAMPLE 7

Fe-Ni alloy line of 0.5 mm$\phi$ on which Ag was plated was used as a base material and a paste having the following composition was painted on the base material according to the die method.

$ErBa_2Cu_3O_{7-\delta}$: 2.0 $\mu m\phi$ (average particle size) ($\delta$=0.1–0.3) 75 wt %
ethyl cellulose: 10 wt %
butyl carbinol: remaining weight percentages The line on which this paste had been painted was processed for 1 minute at 600° C. and then for 25 minutes at 950° C. in an air furnace. A coating layer of 30 $\mu m$ was obtained.

The line material thus obtained was continuously passed, in $O_2$ atmosphere of 1 atm, through a heating and cooling apparatus of the vertical type in which a high frequency heating furnace and a cooling section were combined as shown in FIG. 1. In FIG. 1, numeral 1 represents the high frequency heating furnace, 2 the cooling section consisting of AlN water cooling dies, 3 Fe-Ni alloy line, 4 Ag-plated layer, and 5 ErBa$_2$Cu$_3$O$_{7-\delta}$.

The line material which is made by plating Ag layer 4 on Fe-Ni alloy line 3 to form the base material and coating Er Ba$_2$Cu$_3$O$_{7-\delta}$ 5 on the base material is heated to 1400° C. in high frequency heating furnace 1, 20 mm long, and is thus melted thereon. The line material thus obtained is quickly cooled and solidified by water cooling dies 2 made of AlN and arranged just under high frequency heating furnace 1. The cooling speed is changed by varying both the interval between AlN water cooling dies 2 and high frequency heating furnace 1 and the speed of the line material fed.

The superconductive layer formed on the line material is solidified in one direction when the cooling speed and temperature gradient are appropriate, so that its crystals can be oriented in such a way that axes c of its crystals of the perovskite type are arranged perpendicular to the longitudinal direction of the line material.

The cooling speed most suitable for obtaining this orientation of crystals is in a range of 20°–100° C./sec. The interval between high frequency heating furnace 1 and water cooling AlN dies 2 is 20 mm this time and the speed of the line material fed is in a range of 20–100 mm/min. The line material was heated and cooled in this example keeping the feeding speed of the line material to be 10, 20, 50, 100 and 200 mm/min. The thickness of the superconductive layer on the finished line product was 25 μm in any of these cases.

The orientation of the line product thus obtained was measured and its critical current density (Jc) was also measured at the liquid nitrogen temperature (77° K.). The external magnetic field (H) under which the critical current density (Jc) was measured was 1T. The orientation was expressed by those percentages which were obtained by dividing the sum of integrated strengths of (001) diffracting peaks calculated from XRD (X-ray diffracting device) by the sum of integrated strengths of these and other diffracting peaks. Results thus obtained are shown in Table 2.

TABLE 2

|  | Feeding speed (mm/min) | Orientation (%) | Jc at 77K 0 Tesla (A/cm$^3$) |
|---|---|---|---|
| Example 7 - 1 | 10 | 87 | 580 × 10$^3$ |
| Example 7 - 2 | 20 | 90 | 720 × 10$^3$ |
| Example 7 - 3 | 50 | 95 | 980 × 10$^3$ |
| Example 7 - 4 | 100 | 90 | 700 × 10$^3$ |
| Example 7 - 5 | 200 | 85 | 500 × 10$^3$ |

As apparent from Table 2, high Jc are obtained even in the external magnetic field of 1T thanks to the excellent orientation of crystals in this Example. The orientation of crystals seems to be reduced when the speed of the line material fed is too low or too high.

Another embodiment of the present invention will be described referring to examples 8 through 11 and comparison examples 3 through 4.

EXAMPLE 8

A raw material powder was made by mixing 2% of powdered silver peroxide with ceramic superconductive matter powder having a composition of previously burned YBa$_2$Cu$_3$O$_{7-\delta}$(δ=0.1–0.3). The raw material powder was filled into a platinum pipe which had an outer diameter of 10 mmφ, an inner diameter of 9.5 mmφ and a length of 100 mm, and the platinum pipe was then closed at one end thereof. The platinum pipe filled with the raw material powder was held vertical and its open end upside by the chuck made of zirconia and moved downward in a high frequency coil which had an inner diameter of 20 mmφ and a length of 50 mm, adding a tension of 10 kgf/mm$^2$ to the pipe to elongate it to have an outer diameter of 8 mmφ while melting the raw material powder made to fill it. Heating, melting and elongating were repeated 12 times to provide a ceramic superconductive line product which had an outer diameter of 1 mmφ. The line material was quickly cooled and solidified by water sprayed at the outlet of the high frequency coil in the course of the final elongating process.

EXAMPLE 9

Nitrates Y, Ba and Cu were mixed at a mol ratio of Y:Ba:Cu=1:2:3 and the mixture of these nitrates was coprecipitated with oxalic acid. The deposition thus obtained was burned for 6 hours at 500° C. in an oxygen atmosphere after its being dried, and then powdered to provide a ceramic superconductive precursor powder which was to be used as raw material powder. This raw material powder was filled in an SUS 304 stainless steel pipe which had an outer diameter of 10 mmφ, an inner diameter of 9 mmφ and a length of 100 mm, and the pipe was then closed at one end thereof. The pipe in which the raw material powder had been filled was heated, melted and elongated, using the same high frequency coil and under the same condition as in Example 8, in a quartz chamber which had an inner diameter of 50 mmφ and a length of 800 mm and through which oxygen was being passed at a rate of 2 l/min. A ceramic superconductive line product having an outer diameter of 1 mmφ was thus prepared.

COMPARISON EXAMPLE 3

The ceramic superconductive matter powder having a composition of YBa$_2$Cu$_3$O$_{7-\delta}$ (δ=0.1–0.3) was filled in the SUS 304 stainless steel pipe which had an outer diameter of 10 mmφ, an inner diameter of 9 mmφ and a length of 100 mm, and the pipe was closed at both ends thereof by welding. The pipe was then elongated by roller dies to have an outer diameter of 1 mmφ and sintered for 10 hours at 900° C. in atmosphere.

Filled density, crystal particle size, critical temperature (Tc) and critical current density (Jc) were measured about three kinds of these Examples 8, 9 and Comparison example 3. Results thus obtained are shown in Table 3.

TABLE 3

|  | Field density (%) | Crystal Particle size * (μm) | Tc (K) | Jc at 77K 0 tesila (A/cm$^2$) |
|---|---|---|---|---|
| Example 8 | 99.5 | 1 | 94 | 4 × 10$^3$ |
| Example 9 | 99.5 | 1 | 94 | 4 × 10$^3$ |
| Comparison example 3 | 90 | 20 | 92 | 2 × 10$^2$ |

* Average value

As apparent form Table 3, the products prepared according to the present invention are higher in filled density, smaller in crystal particle size and much higher in Jc, as compared with the Comparison example.

EXAMPLE 10

Silver peroxide powder of 2% was mixed with the ceramic superconductive matter powder having a composition of $YBa_2Cu_3O_{7-\delta}$ ($\delta=0.1-0.3$) to provide a mixed powder, which was filled (filled density=60%) in a platinum pipe which had an outer diameter of 10 mm$\phi$, an inner diameter of 9.5 mm$\phi$ and a length of 100 mm. The platinum pipe in which the mixed powder had been filled was elongated, using roller dies, till it had an outer diameter of 1 mm$\phi$ and a line material thus obtained was passed through a high frequency coil which had an outer diameter of 5 mm$\phi$ and a length of 20 mm, to thereby melt the powder in the line material by high frequency heat. Zone melting was carried out feeding the line material in the longitudinal direction thereof at a speed of 1 mm/min through the continuous melting zone. Air cooling was continuously applied to the line material to solidify the melted powder in the line material in one direction.

The line product thus obtained had a high filled density of 99% and a remarkable orientation in which its crystal faces C were arranged in its longitudinal direction. Therefore, critical temperature (Tc) and critical current density (Jc) were high in the longitudinal direction of the line product, showing Tc of 94 K. and Jc of $7\times 10^3$ A/cm$^2$ under liquid nitrogen temperature 0 Tesla.

EXAMPLE 11

$Y_2O_3$, $BaCO_3$ and CuO were used as oxide raw material powder and they were mixed in the automatic mortar at a mol ratio of Y:Ba:Cu=1:2:3. This mixture was virtually burned for 20 hours at 920° C. in oxygen atmosphere and then powdered to make a secondary raw material powder. Various amounts of CuO powder shown in Table 4 were added to this secondary raw material powder of 100 weight parts and mixed in the automatic mortar to prepare a mixed oxide raw material powder. The mixed oxide raw material powder was extruded and coated, at 500° C., directly on a Pt-Rh alloy line (or core material) which had a diameter of 1 mm$\phi$ to thereby provide a composite line material having an outer diameter of 1.8 mm$\phi$. The composite line material was subjected to isothermal heating treatment for 5 hours at various temperatures shown in Table 4 in oxygen atmosphere, using the electric furnace of the batch type, then melted on the surface thereof, and gradually cooled at a cooling speed of 3° C./min. Or the composite line material was held for about 5 hours under various heat treating temperatures shown in Table 4, continuously passed through the electric furnace, which had a temperature gradient of 100° C./cm, in the longitudinal direction thereof and gradually cooled at an average cooling speed of 1° C./min to the room temperature. Density, critical current density (Jc) and whether or not anomalous phase such as $Y_2BaCuO_5$ was caused were examined relating to the superconductive line product of the oxide type thus obtained. Results are shown in Table 4. The density in Table 4 represents ratios (%) relative to true density. Jc are values obtained under liquid nitrogen temperature (77° K.) and 0 Gauss and calculated in terms of the whole oxide layer including the layer of CuO.

TABLE 4

|  | CuO (Wt part) | Heat-treating manner | Heat treating temp. (°C.) | Density (%) | Jc (A/cm$^2$) | Anomalous phase |
| --- | --- | --- | --- | --- | --- | --- |
| Example 1 - 1 | 10 | Continuous | 1100 | 97 | 4480 | No |
| Example 1 - 2 | 10 | — | 1300 | 99 | 4530 | — |
| Comparison example 1 - 3 | 10 | Isothermal | 1450 | 99 | 210 | —[*2] |
| Comparison example 1 - 4 | 0 | — | 1050 | 98 | 180 | Found[*1] |

[*1]$Y_2BaCuO_5$ was caused
[*2]remarkably reacted with Pt—Rh

EXAMPLE 12

The mixed oxide raw material powder prepared in same manner as in Example 11 was filled in a Pt-Rh alloy pipe (outer diameter: 10 mm$\phi$, inner diameter: 7 mm$\phi$) and this pipe was cold-worked to a composite line which had an outer diameter of 0.5 mm$\phi$. The composite line was thereafter heat-processed in same way as in Example 11. Same examination as in Example 11 was conducted about the superconductive line product of the oxide type thus obtained. The conditions under which the superconductive line product of the oxide type was prepared and examination results obtained about this line product are shown in Table 5.

As apparent from Tables 4 and 5, any of the oxide superconductive line products (1-1, 1-2 and 2-1, 2-2) prepared according to the present invention has no anomalous phase and is high in density and critical current density. On the other hand, both of comparison examples 1-3 and 2-3 prepared under such heat treating temperatures as not included in the temperature range of the present invention are low in Jc. Particularly in the case of comparison examples 1-4 and 2-4 in which no CuO powder was mixed, anomalous phase ($Y_2BaCuO_5$) is caused and in the case of comparison examples 1-3 and 2-3 whose heat-treating temperatures were too high, the mixed oxide raw material is remarkably reacted with the core or Pt-Rh alloy.

TABLE 5

|  | Material of metal pipe | CuO (Wt part) | Heat-treating manner | Heat-treating temp. (°C.) | Density (%) | Jc (A/cm$^2$) | Anomalous phase |
| --- | --- | --- | --- | --- | --- | --- | --- |
| Example 2 - 1 | Pt—Rh | 10 | Continuous | 1050 | 96 | 5240 | No |
| Example 2 - 2 | — | 10 | — | 1300 | 99 | 5380 | — |
| Comparison example 2 - 3 | Pt—Rh | 10 | Isothermal | 1450 | 99 | 240 | —[*2] |

TABLE 5-continued

|  | Material of metal pipe | CuO (Wt part) | Heat-treating manner | Heat-treating temp. (°C.) | Density (%) | Jc (A/cm$^2$) | Anomalous phase |
|---|---|---|---|---|---|---|---|
| Comparison example 2 - 4 | — | 0 | — | 1050 | 97 | 200 | Found[*1] |

[*1]Y$_2$BaCuO$_5$ was caused.
[*2]remarkably reacted with Pt—Rh.

EXAMPLE 13

Bi$_2$O$_3$, mSrCo$_3$, CaCO$_3$ and CuO were used as oxide raw material powder and they were mixed in the automatic mortar at a mol ratio of Bi:Sr:Ca:Cu=1:1:1:2. The mixture was virtually burned for 20 hours at 820° C. in atmosphere. A composite line product was thereafter prepared according to same manner as in Example 11 and heat process was applied to the composite line product at various temperatures shown in Table 3 according to same manner as in Example 11 except that it was heat-processed in atmosphere. Same examination as in Example 11 was conducted about the superconductive line product of the oxide type thus obtained and results are shown in Table 6.

EXAMPLE 14

The mixed oxide raw material powder prepared in same manner as in Example 13 was filled in an Ag or Pt-Rh alloy pipe (outer diameter: 10 um$\phi$, inner diameter: 7 mm$\phi$) and the pipe was cold-worked to a composite line whose outer diameter was 0.5 mm$\phi$. Same heat process as in Example 13 was thereafter applied to the composite line and same examination as in Example 11 was conducted about the superconductive line product of the oxide type thus obtained. Conditions under which the superconductive line product of the oxide type was prepared and examination results obtained are shown in Table 7.

As apparent from Tables 6 and 7, any of the superconductive line products of the oxide type (3-1-3-7 and 4-1-4-6) has no anomalous phase and is high in density and critical current density (Jc).

TABLE 6

|  | CuO (Wt part) | Heat-treating manner | Heat treating temp. (°C.) | Density (%) | Jc (A/cm$^2$) | Anomalous phase |
|---|---|---|---|---|---|---|
| Example |  |  |  |  |  |  |
| 3 - 1 | 0.1 | Isothermal | 1200 | 96 | 580 | No |
| 3 - 2 | 1.0 | — | 1050 | 97 | 690 | — |
| 3 - 3 | 5 | — | 1350 | 99 | 670 | — |
| 3 - 4 | 30 | — | 950 | 94 | 510 | — |
| 3 - 5 | 10 | Continuous | 950 | 94 | 720 | — |
| 3 - 6 | 10 | — | 1050 | 97 | 860 | — |
| 3 - 7 | 10 | — | 1250 | 98 | 870 | — |
| 3 - 8 | 0.05 | Isothermal | 1050 | 95 | 35 | Found[*3] |
| Comparison examples |  |  |  |  |  |  |
| 3 - 9 | 35 | — | 1050 | 97 | 80 | No |
| 3 - 10 | 10 | — | 1400 | 99 | 53 | —[*2] |
| 3 - 11 | 0 | — | 1050 | 97 | 30 | Found[*3] |

[*2]remarkably reacted with Pt—Rh

When they are continuously passed through the electric furnace which has a temperature gradient and their crystals are thus oriented, particularly Jc is high (in the cases of 3-5-3-7 and 4-4-4-6). On the other hand, any of comparison examples 3-8-3-7 and 4-7-4-10 in which the mixing ratio of CuO powder and their heat processing temperatures were out of the range of the present invention has low Jc.

TABLE 7

|  | Material of metal pipe | CuO (Wt part) | Heat-treating manner | Heat-treating temp. (°C.) | Density (%) | Jc (A/cm$^2$) | Anomalous phase |
|---|---|---|---|---|---|---|---|
| Example |  |  |  |  |  |  |  |
| 4 - 1 | Pt—Rh | 0.1 | Isothermal | 1200 | 96 | 270 | No |
| 4 - 2 | — | 1.0 | — | 1050 | 97 | 330 | — |
| 4 - 3 | — | 10 | — | 1350 | 99 | 250 | — |
| 4 - 4 | Ag | 10 | Continuous | 950 | 94 | 650 | — |
| 4 - 5 | Pt—Rh | 10 | — | 1050 | 97 | 760 | — |
| 4 - 6 | — | 10 | — | 1250 | 99 | 790 | — |
| 4 - 7 | — | 0.05 | Isothermal | 1050 | 95 | 41 | Found[*3] |
| Comparison examples |  |  |  |  |  |  |  |
| 4 - 8 | Pt—Rh | 35 | — | 1050 | 97 | 83 | No |
| 4 - 9 | — | 10 | — | 1400 | 99 | 46 | —[*2] |

TABLE 7-continued

| Material of metal pipe | CuO (Wt part) | Heat-treating manner | Heat-treating temp. (°C.) | Density (%) | Jc (A/cm$^2$) | Anomalous phase |
|---|---|---|---|---|---|---|
| 4 - 10 | — | 0 | — | 1050 | 97 | 25 | Found[*3] |

[*2]remarkably reacted with Pt—Rh
[*3]anomalous phases (CacuO and biSrO groups) are caused Particularly in the case of comparison examples 3-11 and 4-10 in which no CuO powder was mixed and of comparison examples 3-8 and 4-7 in which the mixing ratio of CuO powder was too low, anomalous phases (CaCuO group, BiSrO group) are caused.

EXAMPLE 15

Ceramic superconductive matter powder having a composition of $YBa_2Cu_3O_{7-\delta}$ ($\delta=0.1$–$0.3$) was filled in an SUS 304 stainless steel pipe which had an outer diameter of 10 mm$\phi$, an inner diameter of 9 mm$\phi$ and a length of 100 mm (filled density: 60%). The stainless steel pipe in which the powder has been filled was elongated to a line having an outer diameter of 1 mm$\phi$, the line was locally heated by the high frequency coil to melt the powder in the line, and zone melting was applied to the line, feeding it at a speed of 1 mm/min, to thereby solidify the melt in a direction. The high frequency heating and the cooling following this heating were carried out in oxygen abundant atmosphere in which oxygen partial pressure was 0.9. The line product thus obtained has a high filled density of 99% and a remarkable face-C-arranged orientation. Critical temperature (Tc) is 94 and critical current density (Jc) under the liquid nitrogen temperature and at 0 Tesler is $5\times 10^3$ A/cm$^2$.

COMPARISON EXAMPLE 4

Ceramics superconductive powder whose composition is represented by $YBa_2Cu_3O_{7-\delta}$ ($\delta=0.1$ to $0.3$) was filled in a SUS304 stainless pipe (filling density: 60%) having an outer diameter of 10 mm$\phi$, an inner diameter of 9 mm$\phi$, and a length of 100 mm. This pipe is drawn until the outer diameter thereof becomes to be 1 mm, and was sintered in an atmosphere of 900° C.×10 hr. The wire thus obtained has a filling density of 90%, a critical temperature (Tc) of 93° K., a temperature of liquid nitrogen, and a critical current density (Jc) at 0 Tesla of $2\times 10^2$ A/cm$^2$.

Then, the invention of subclaim 4 will now be described with reference to examples 16 and 17 and comparison example 5.

EXAMPLE 16

Ceramics superconductive powder whose composition is represented by $YB_2Cu_3O_{7-\delta}$ ($\delta=0.1$ to $0.3$) was mixed with 2% of silver peroxide, and the mixture powder thus obtained. The mixed powder was filled in a platinum pipe which had an outer diameter of 10 mm$\phi$, an inner diameter of 9.5 mm$\phi$ and a length of 100 mm (filled density: 60%) The platinum pipe in which powder had been filled was elongated to a line which had an outer diameter of 1 mm$\phi$, using the roller dies. 19 pieces of these lines were used to form a twisted line which had a pitch of 10 mm. The twisted line was passed through a high frequency coil which had an inner diameter of 10 mm$\phi$ and a length of 20 mm to thereby melt the powder in the lines by high frequency heat. Zone melting was carried out by moving the twisted line in the longitudinal direction thereof at a feeding speed of 1 mm/min through the continuous melting zone. Air cooling was continuously applied to the twisted line to solidify the melt in a direction.

The twisted line product thus obtained had a high filled density of 99% and a remarkable orientation in which faces C of crystals were arranged along the longitudinal direction of the line. Critical temperature (Tc) and critical current density (Jc) in the longitudinal direction of the line were high accordingly, showing Tc of 94 K. and Jc of $7\times 10^3$ A/cm$^2$ under the liquid nitrogen temperature and 0 Tesla.

EXAMPLE 17

Ceramic superconductive matter powder having a composition of $YBa_2Cu_3O_{7-\delta}$ ($\delta=0.1$–$0.3$) was filled in an SUS 304 stainless steel pipe which had an outer diameter of 10 mm$\phi$, an inner diameter of 9 mm$\phi$ and a length of 100 mm (filled density: 60%). The stainless steel pipe in which the powder had been filled was elongated in same way as in Example 16 to a line which had an outer diameter of 1 mm$\phi$. 19 pieces of these lines were bundled to a twisted line, which was then made to a coil having an outer diameter of 100 mm$\phi$ and 10 turns. The end of the coil was locally heated, using same high frequency coil as that in Example 16, to melt the powder in the coil. Zone melting was applied to the coil-like line material, feeding it in its longitudinal direction at a speed of 1 mm/min while being rotated, and the melt was the solidified in a direction. The high frequency heating and the cooling following this heating were carried out in oxygen-abundant atmosphere in which oxygen partial pressure was 0.9.

The coil product thus obtained showed that each of the line materials had a high filled density of 99% and a remarkable face-C-arranged orientation same as that in Example 16. Critical temperature (Tc) was 94 K. and critical current density was $5\times 10^2$/cm$^2$ under the liquid nitrogen temperature and 0 Tesla.

COMPARISON EXAMPLE 5

Ceramic superconductive matter powder having a composition of $YBa_2Cu_3O_{7-\delta}$ ($\delta=0.1$–$0.3$) was filled in an SUS 304 stainless steel pipe which had an outer diameter of 10 mm$\phi$, an inner diameter of 9 mm$\phi$ and a length of 100 mm (filled density: 60%). The stainless steel pipe in which the powder had been filled was elongated in same way as in Example 16 to a line which had an outer diameter of 1 mm. 19 pieces of these lines were used to form a twisted line whose pitch was 10 mm. The twisted line was sintered for 10 hours at 900° C. in the air. The twisted line product thus obtained had a filled density of 90%. Critical temperature (Tc) was 92 K. and critical current density (Jc) was $2\times 10^2$ A/cm$^2$ under the liquid nitrogen temperature and 0 Tesla.

What is claimed is:

1. A method of manufacturing a superconductive product comprising:

heating a longitudinally elongated body comprising a superconductive material selected from the group consisting of $BiSrCaCu_2O_y$ and $Tl_2Ba_2Ca_2Cu_3O_z$ to a temperature higher than the melting point of the superconductive material, thereby melting the superconductive material and obtaining a molten superconductive material; and continuously passing said elongated body through a furnace having a temperature gradient from a high temperature region in the furnace toward a low temperature region in an outlet of the furnace, the temperature gradient being 100° C./cm, wherein the temperature in the outlet of the furnace is lower then the melting point of the superconductive material, so as to cool the molten superconductive material in the longitudinal direction of said elongated body, wherein an average cooling rate for cooling the molten superconductive material is 1° C./minute, thereby solidifying and recrystallizing the superconductive material along said elongated body such that the a-axis or the b-axis of each crystal of the superconductive material is oriented in the longitudinal direction of said elongated body.

2. The method according to claim 1, wherein said elongated body is prepared by filling the superconductive material into a line-like metal pipe.

3. The method according to claim 1, wherein said elongated body is prepared by filling the superconductive material into a plurality of line-like metal pipes.

4. The method according to claim 1, wherein the superconductive material is an oxide superconductor.

5. The method according to claim 1, wherein the heating and cooling are carried out in an oxygen-rich atmosphere.

6. The method according to claim 1, wherein a small amount of metal peroxide is mixed in advance with the superconductive material.

7. The method according to claim 6, wherein the metal peroxide is silver peroxide.

8. The method according to claim 1, wherein the temperature in the outlet of the furnace is about 500° C.

9. The method according to claim 1, wherein the superconductive material is $BiSrCaCu_2O_y$.

10. The method according to claim 1, wherein the superconductive material is $Tl_2Ba_2Ca_2Cu_3O_z$.

11. A method of manufacturing a superconductive product comprising:

heating a longitudinally elongated body comprising a precursor of a superconductive material selected from the group consisting of $BiSrCaCu_2O_y$ and $Tl_2Ba_2Ca_2Cu_3O_z$ to a temperature higher than the melting point of said precursor, thereby melting said precursor and obtaining a molten precursor; and then continuously passing said elongated body through a furnace having a temperature gradient from a high temperature region in the furnace toward a low temperature region in an outlet of the furnace, the temperature gradient being 100° C./cm, wherein the temperature in the outlet of the furnace is lower then the melting point of the superconductive material, so as to cool the molten superconductive material in the longitudinal direction of said elongated body, wherein an average cooling rate for cooling the molten superconductive material is 1° C./minute, thereby converting said precursor into a superconductive material and solidifying and recrystallizing the superconductive material along said elongated body such that the a-axis or the b-axis of each crystal of the superconductive material is oriented in the longitudinal direction of said elongated body.

12. The method according to claim 11, wherein said elongated body is prepared by filling the precursor into a line-like metal pipe.

13. The method according to claim 11, wherein said elongated body is prepared by filling the precursor into a plurality of line-like metal pipes.

14. The method according to claim 11, wherein said precursor of the superconductive material is made of a material selected from the group consisting of an oxide, a hydroxide, a halide, a carbonate and a nitrate of an inorganic acid, an acetate, an oxalate or an alkoxide, which all include a constituent element of an oxide superconductor including at least an alkaline earth metal and copper.

15. The method according to claim 11, wherein said heating and cooling are carried out in an oxygen-rich atmosphere.

16. The method according to claim 11, wherein a small amount of metal peroxide is previously mixed with said precursor.

17. The method according to claim 16, wherein the metal peroxide is silver peroxide.

18. The method according to claim 11, wherein the temperature in the outlet of the furnace is about 500° C.

19. The method according to claim 11, wherein the superconductive material is $BiSrCaCu_2O_y$.

20. The method according to claim 11, wherein the superconductive material is $Tl_2Ba_2Ca_2Cu_3O_z$.

* * * * *